United States Patent [19]

Moorhead et al.

[11] Patent Number: 6,110,855
[45] Date of Patent: Aug. 29, 2000

[54] PROCESS FOR STRENGTHENING ALUMINUM BASED CERAMICS AND MATERIAL

[75] Inventors: Arthur J. Moorhead, Knoxville, Tenn.; Hyoun-Ee Kim, Seoul, Rep. of Korea

[73] Assignee: The United States of America as represented by the United States Department of Energy, Washington, D.C.

[21] Appl. No.: 09/050,371

[22] Filed: Mar. 31, 1998

[51] Int. Cl.[7] .................................................. C04B 35/10

[52] U.S. Cl. ...................... 501/127; 501/128; 427/255.1; 427/255.3; 264/82

[58] Field of Search ...................... 501/127, 128; 428/403, 404; 427/419.2, 377, 255.1, 255.2, 255.3; 264/82

[56] References Cited

U.S. PATENT DOCUMENTS

| H1166 | 4/1993 | Kim et al. . | |
|---|---|---|---|
| 3,837,891 | 9/1974 | Tietz | 428/377 |
| 4,139,833 | 2/1979 | Kirsch | 427/124 |
| 5,145,719 | 9/1992 | Towata et al. | 427/403 |
| 5,273,619 | 12/1993 | Masahiro et al. | 501/127 |

*Primary Examiner*—Michael Marcheschi
*Attorney, Agent, or Firm*—Emily G. Schneider; Stephen D. Hamel; William R. Moser

[57] ABSTRACT

A process for strengthening aluminum based ceramics is provided. A gaseous atmosphere consisting essentially of silicon monoxide gas is formed by exposing a source of silicon to an atmosphere consisting essentially of hydrogen and a sufficient amount of water vapor. The aluminum based ceramic is exposed to the gaseous silicon monoxide atmosphere for a period of time and at a temperature sufficient to produce a continuous, stable silicon-containing film on the surface of the aluminum based ceramic that increases the strength of the ceramic.

5 Claims, 3 Drawing Sheets

PROCESS FOR STRENGTHENING ALUMINUM BASED CERAMICS AND MATERIAL

This invention relates generally to a process for strengthening ceramics and more particularly to a process for strengthening aluminum based ceramics. The United States Government has rights to this invention pursuant to Contract No. DE-AC0596OR22464 with Lockheed Martin Energy Research Corporation, awarded by the U.S. Department of Energy.

BACKGROUND OF THE INVENTION

Aluminum oxide ceramics (also known as alumina ceramics), both monolithic materials and aluminum oxide based composites, as well as other aluminum based ceramics, are a widely used class of materials. Uses for these materials include furnace tubes, spark plug insulators, cutting tool inserts, and substrates for electronic components among others. In comparison to most other structural ceramics, the alumina ceramics possess outstanding corrosion resistance and dielectric strengths, but only modest mechanical strengths. As is the case with other structural ceramics, the alumina ceramics fail to reach their full potential with respect to mechanical strength because of strength-limiting surface flaws that are invariably introduced during fabrication. It is well established that the strengths of these materials are generally only one tenth to one hundredth of that which theoretically should be attainable. The reason for this behavior is that ceramics fail from the stress induced propagation of microscopically small cracks, not from an overstress condition. These detrimental flaws may originate either from defects such as pores, particle agglomerates or microcracks introduced into the material during the sintering process, or as a result of later operations such as slicing or grinding. Because the failure of a ceramic material is so dependent on the population and distribution of such flaws, the strength of the ceramic is statistical in nature, depending on the probability that a flaw severe enough to cause fracture at a given applied stress is present in the volume of material that is exposed to the peak stress. Thus it follows, that the observed strength is related to the volume or surface areas under stress and the number and severity of flaws in that volume area.

It has been experimentally determined that the most damaging flaws in a ceramic body are those at, or very near, the surface. Surface flaws are particularly detrimental at a surface which experiences tensile forces, since cracks tend to open and propagate under tensile forces. Thus, it can be seen that the strength of a ceramic material can be increased by altering the surface region to remove, or reduce the number or size of strength limiting flaws. This may be accomplished in some cases by polishing the surface to a mirror like finish, but this is an expensive, time consuming process that is not a practical solution for most commercial ceramic products.

The use of strengthened aluminum based ceramics would be beneficial in present applications because thinner cross-sections would be possible, thus saving on materials and allowing for overall smaller components. Greatly improving the strength of the aluminum based ceramics might also allow these materials to be used in applications which at present require stronger, costlier materials, such as silicon nitride or silicon carbide ceramics. Furthermore, while earlier work set forth in USSIR H1166 entitled "Process for strengthening silicon based ceramics" discloses a process for strengthening ceramics similar to the process of the present invention, it is limited to structural ceramics containing silicon, and does not teach or suggest a method that can be used to strengthen aluminum based ceramics that do not contain silicon as in the present invention. Moreover, the level of strengthening achieved in the method of the present invention is almost twice that achieved for silicon based ceramics. Accordingly, there is a need for an economical process to improve the strength of aluminum based ceramics.

SUMMARY OF THE INVENTION

In view of the above need, it is an object of this invention to provide a process for increasing the strength of aluminum based ceramics.

It is another of object of this invention to provide a process as in the above object that forms a continuous, stable silicon-containing film on the surface of an aluminum based ceramic which blunts, heals, or otherwise diminishes the effect of surface flaws that limit the strength of the aluminum based ceramic.

Further, it is an object of the invention to provide a composition of matter comprising an aluminum based ceramic having a continuous, stable silicon-containing layer on the surface of the ceramic which increases the strength of the ceramic by blunting surface cracks on said ceramic.

Briefly, the present invention is a process for strengthening an aluminum based ceramic, comprising forming a gaseous atmosphere consisting essentially of silicon monoxide gas; and exposing the aluminum based ceramic to the gaseous silicon monoxide atmosphere for a period of time and at a temperature sufficient to produce a continuous, stable silicon-containing film on the surface of the aluminum based ceramic that increases the strength of said ceramic.

Additional objects, advantages, and novel features of the invention will be set forth in part in the description which follows, and in part will become apparent to those skilled in the art upon examination of the following or may be learned by the practice of the invention. The objects and advantages may be realized and attained by means of the instrumentalities and combinations particularly pointed out herein and in the appended claims.

DETAILED DESCRIPTION

Figure 1:
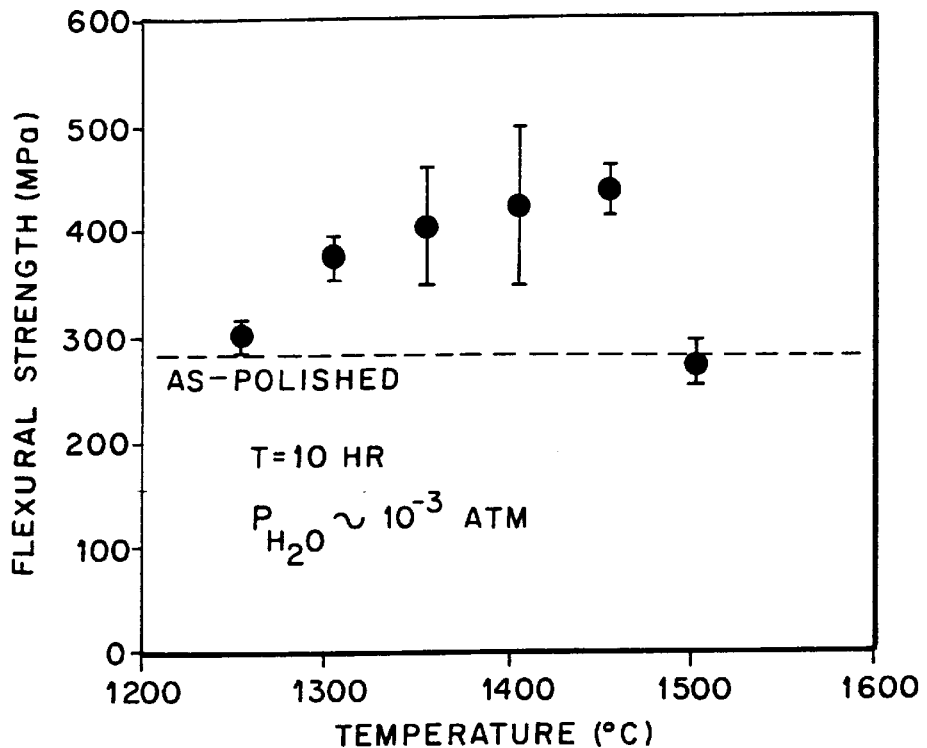
FIG. 1 is a graph showing the average room-temperature flexural strength of polished alumina specimens placed above a SiC platelet bed and exposed to a wet hydrogen atmosphere ($P_{H2O}$ of about $10^{-3}$ atm) for ten hours at various temperatures.

The term "aluminum based ceramics" as used in the specification and claims means monolithic aluminum oxide based ceramics, aluminum oxide based ceramic composites, and non-oxide aluminum-bearing ceramics.

To achieve the foregoing and other objects, the process of this invention comprises exposing an aluminum based ceramic article to an atmosphere consisting essentially of silicon monoxide gas for a period of time and at a temperature sufficient to produce a silicon containing film on the surface of the ceramic article that greatly increases the strength of the ceramic. In the preferred process, the gaseous silicon monoxide atmosphere is formed by exposing a source of silicon such as silicon carbide platelets or coarse silicon carbide power to an atmosphere consisting essentially of hydrogen and a sufficient amount of water vapor. At sufficiently high temperatures and partial pressures of water in the hydrogen, the silicon carbide is oxidized by the water in the gas mixture dioxide to form gaseous silicon monoxide (SiO) which in turn reacts with the ceramic to form a surface layer of aluminum silicate (e.g., mullite, $3Al_2O_3 - 2SiO_2$) or other silicon containing compound that blunts, heals or otherwise diminishes the effect of surface flaws that limit the strength of the ceramic. The preferred process uses a hydrogen atmosphere having a partial pressure of water vapor ($P_{H2O}$) of about $10^{-3}$ atmospheres, a temperature of about 1300° to 1500° C., and times ranging from 0.5 to 10 hours. One suitable source of silicon, which is converted to gaseous silicon monoxide in the process, is silicon carbide platelets. The silicon carbide platelets are oxidized by the water in the hydrogen atmosphere to form the silicon monoxide gas. Silicon carbide powder can also be used, but silicon carbide platelets are preferred because they have a lower specific surface area, and provide a slower, more controllable release of SiO gas. However, the desired SiO generation rate is also specific to the process equipment being used, such as furnace volume, number of articles being treated, etc, so that in some cases, other materials, such as coarse silicon carbide powder may be suitable.

EXAMPLES

The following examples are given to illustrate the process of the present invention and are not to be taken as limiting the scope of the invention which is defined in the appended claims. In addition, the time, temperature, and other parameters required in the process will be expected to vary according to the size, shape, specific composition, and other properties of the article or other components such as fixturing involved in the process. Parameters may also be affected by variations in equipment used or in other conditions present in the process environment. Specifically, although a pure hydrogen gas is used in the following examples, it has been shown that mixed gases containing the proper proportions of hydrogen and water vapor are equally effective.

EXAMPLE 1

A single batch of monolithic aluminum oxide ceramic comprised of 99.5% $Al_2O_3$, trade name COORS AD-995, was used in this study. The original material, in the form of coupons with dimensions of 5.1×20.3×50.8 mm (0.2×0.8× 2.0 inches) was ground equally on either face with a 220-grit diamond abrasive wheel to reduce the section thickness to approximately 2.6 mm. One face of each coupon was polished on a vibratory polisher used for preparing samples for microscopic examination. Polishing was accomplished through a series of steps using diamond abrasive slurries ranging from 30 micrometer grit size to 1 micrometer grit size. The polished coupons were cut into 2.5×3.4×24.5 mm bars for flexural testing. The long edges of the tensile face of each bar were lightly beveled on a 6 micrometer grit diamond lap. Groups of flexure bars were exposed for various times and temperatures in a resistance heated alumina-tube furnace. The bars were supported on two 3 mm diameter alumina rods resting on a bed of silicon carbide platelets (C-Axis Technology, Grade M). The tensile surface of the bars faced the surface of the platelet bed. The atmosphere was flowing hydrogen gas having a $P_{H2O}$ of about $10^{-3}$ atmospheres. The hydrogen gas was purified by passing it through columns of $CaSO_4$ and activated alumina. Exposure temperatures ranged from 1250° to 1500° C. and exposure times ranged from about 0.5 hour to about 10 hours. The $P_{H2O}$ was controlled by bubbling a portion of the purified hydrogen through a column of distilled water. The $P_{H2O}$ was measured with a hygrometer. The gas flowed parallel to the tensile surface of the samples with a constant speed of 0.9 cm/sec. After the exposures, four-point bend flexural tests were conducted at room temperature with a cross head speed of 0.008 cm/sec, and inner and outer spans of 6.35 mm and 19.05 mm, respectively.

The strength of the COORS AD-995 alumina was strongly dependent on the temperature at which it was exposed to the hydrogen/water atmosphere as shown in FIG. 1. Under all conditions except for the 1500° C. exposure, the strength of the alumina was actually greater after exposure. In particular, alumina strength was increased by over 50% by exposure to the wet hydrogen atmosphere for ten hours at 1400° or 1450° C. Even following exposure at 1350° C., the strength of the alumina ceramic was over 400 MPa, a value 45% higher than the strength of the unexposed material.

Figure 2:
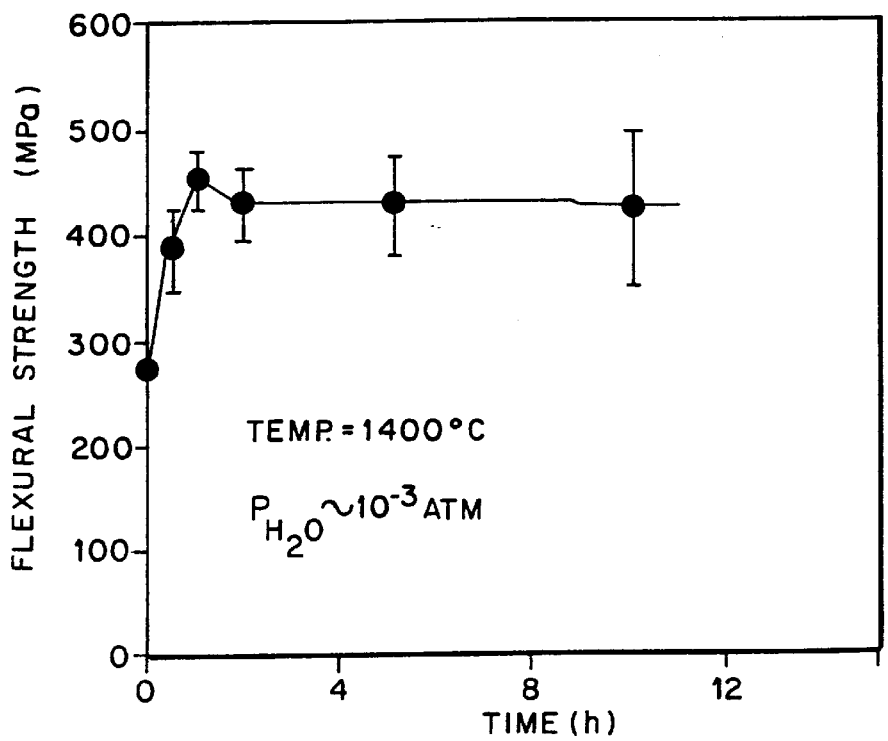
FIG. 2 is a graph illustrating the average room-temperature flexural strength of polished alumina specimens placed above a SiC platelet bed and exposed to a wet hydrogen atmosphere ($P_{H2O}$ of about $10^{-3}$ atm) at 1400° C. for various periods of time.

Time of exposure also played an important role in the degree of strengthening achieved by the process of the present invention. As seen in FIG. 2, the strengthening effect increases rapidly for times up to 1 hour and then is somewhat diminished for longer exposure times. A greater than 61% increase in strength, from 277 MPa up to 447 MPa was observed following exposure of the alumina bars for 1 hour at 1400° C.

In order to confirm that the hydrogen/water atmosphere, in addition to the exposure temperature, was critical to the process of the present invention, a group of bars was exposed over a bed of silicon carbide platelets at 1400° C. for 10 hours in dry hydrogen. A slight increase in strength, from 277 MPa for unexposed material to 285 MPa after heat treatment was observed, thus verifying that a combination of a wet hydrogen atmosphere and elevated temperature are required to achieve the degree of strengthening achieved by the process of the present invention.

EXAMPLE 2

Figure 3:
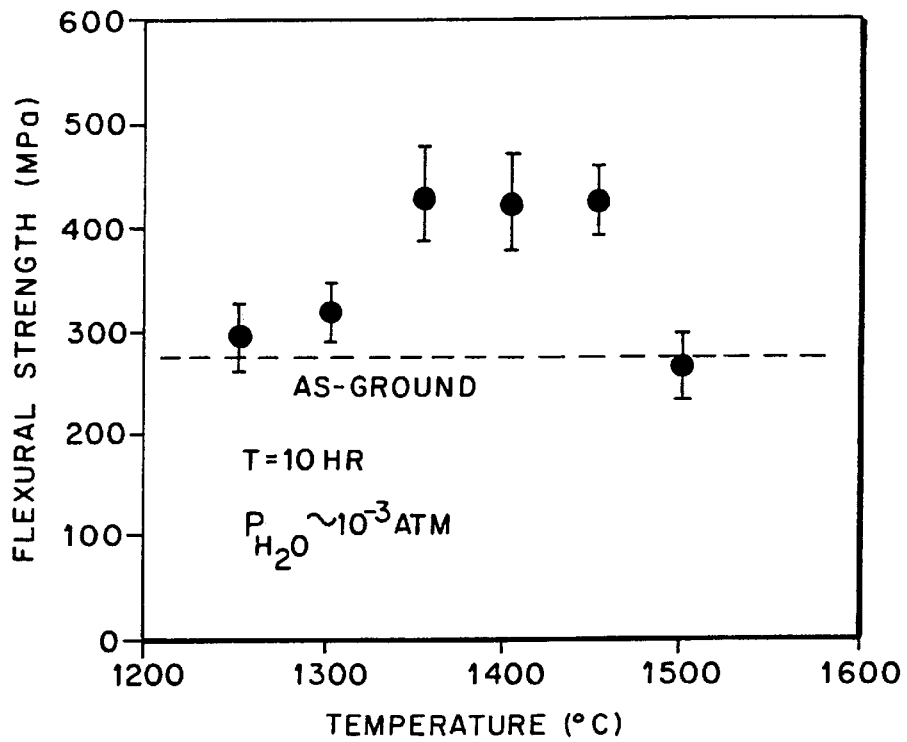
FIG. 3 is a graph showing the average room-temperature flexural strength of ground alumina specimens placed above a SiC platelet bed and exposed to a wet hydrogen atmosphere ($P_{H2O}$ of about $10^{-3}$ atm) for ten hours at various temperatures.

It would be desirable that the strength enhancing process of the present invention be effective on ground surfaces without having to perform an expensive polishing operation. Accordingly, another set of experiments was conducted on the COORS AD-995 ceramic material in which the coupons were ground equally on either face with a 220-grit diamond abrasive wheel to reduce the section thickness to approximately 2.5 mm, but the material was subsequently cut into flexure bars without polishing the tensile surface. The long edges of the tensile face of each bar were slightly beveled on a 6 micrometer diamond lap as in Example 1 and the other details of the exposure and test procedures were the same. As shown in FIG. 3, the results of this study were very similar to the results given in Example 1 for the alumina specimens which were polished prior to exposure. The average strengths of the flexure bars following exposure at 1350°, 1400°, and 1450° C. for 10 hours in a hydrogen atmosphere have a $P_{H2O}$ of about $10^{-3}$ atmospheres were 428 MPa, 422 MPa, and 423 MPa respectively, a very significant increase in each case of at least 50% above that of the unexposed material. In this case, the strengthening effect after exposure of the ground specimens at 1300° C. was somewhat less than that observed in the polished specimens, but the observed lack of a strengthening effect upon exposure at 1500° C. was the same.

Figure 4:
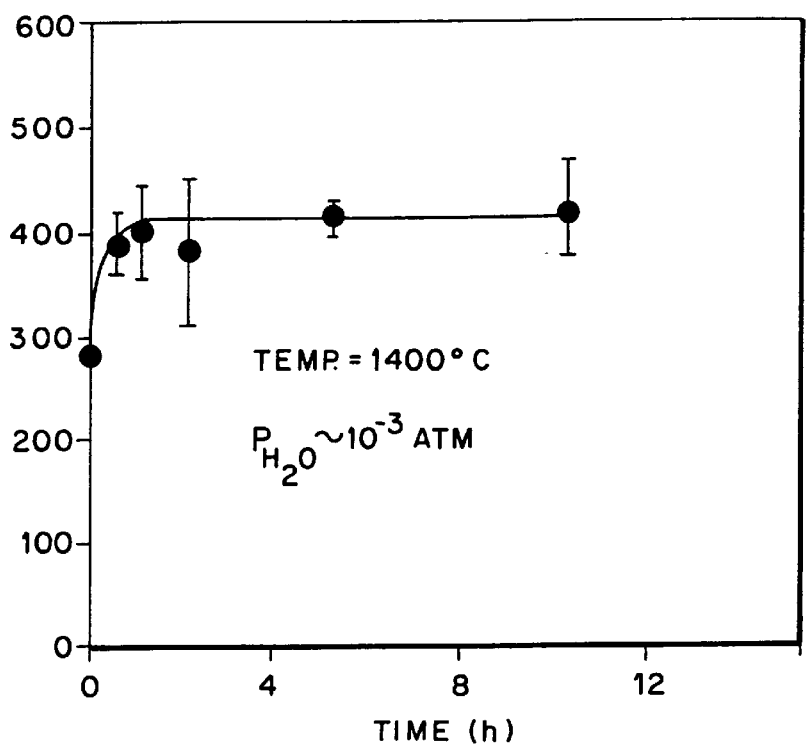
FIG. 4 is a graph showing the average room-temperature flexural strength of ground alumina specimens placed above a SiC platelet bed and exposed to a wet hydrogen atmosphere ($P_{H2O}$ of about $10^{-3}$ atm) at 1400° C. for various periods of time.

As can be seen in FIG. 4, the effect of exposure time was in general similar to that observed for the polished specimens. The strength of the ground specimens exposed at 1400° C. to hydrogen gas with a $P_{H2O}$ of about $10^{-3}$ atm was greatly improved by exposure times of 0.5 hours with some improvement at longer exposure times.

Figure 5:
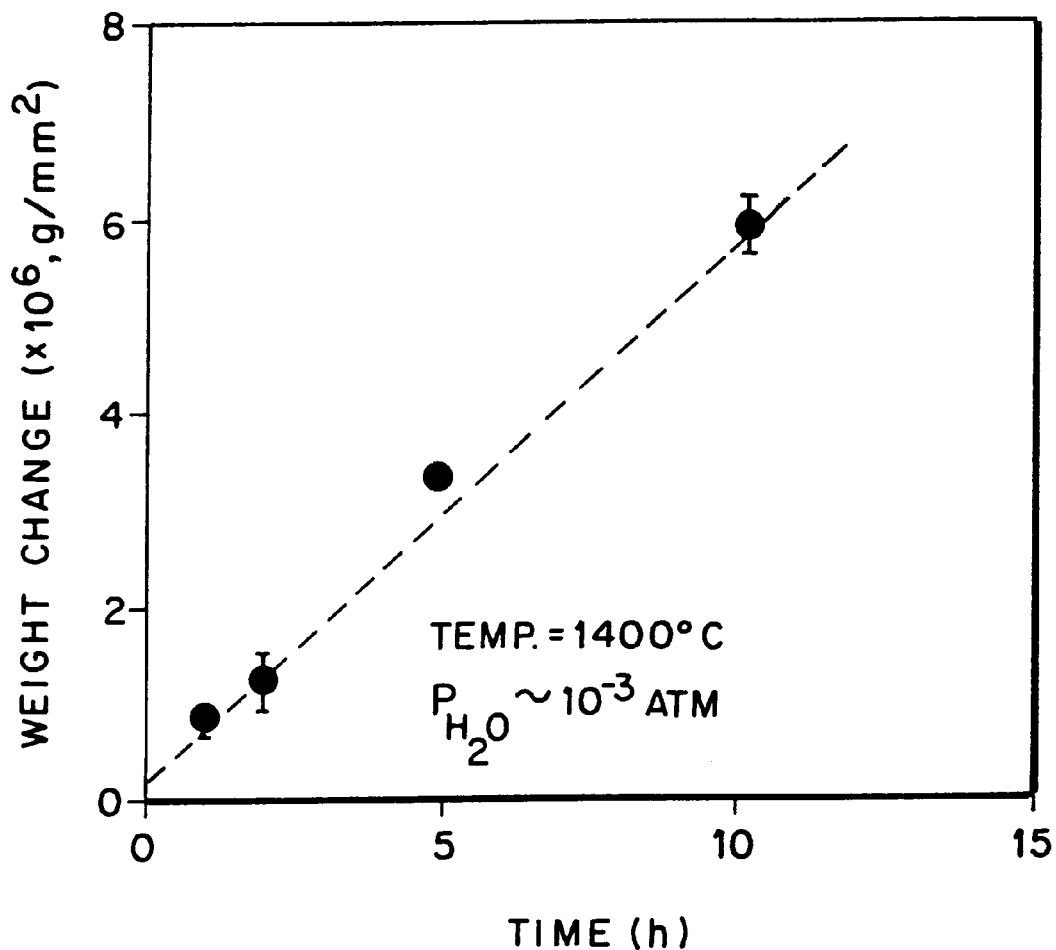
FIG. 5 is a graph illustrating the average specific weight gains of alumina specimens placed above a SiC platelet bed and exposed at exposed to wet hydrogen atmosphere ($P_{H2O}$ of about $10^{-3}$ atm) at 1400° C. for various periods of time.

The observed strengthening effect of the process of the present invention is believed to be due to the blunting of surface cracks by the mullite/glass layer formed on the surface by the deposition of $SiO_2$. The $SiO_2$ was formed when SiO gas (itself generated by the reaction of the SiC platelets with water in the atmosphere) subsequently reacted with ambient water in the atmosphere to form a "smoke" which was deposited on the surface of the alumina specimens. In addition to the above observations of strength enhancement, a linear weight gain with respect to exposure time was shown as seen in FIG. 5. This weight gain was apparently due to the deposition of $SiO_2$ on the alumina surface. It is well established that when materials such as SiC, $Si_3N_4$ or Si are exposed to $H_2$ at a pressure of 1 atm, one of three distinct reactions occurs depending on the $P_{H2O}$ level in the $H_2$. When the $P_{H2O}$ is smaller than about $1 \times 10^{-4}$ atm, active oxidation of SiC occurs by a reaction such as the following:

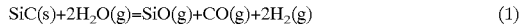

$$SiC(s)+2H_2O(g)=SiO(g)+CO(g)+2H_2(g) \qquad (1)$$

In the above equation, the $P_{SiO}$ is directly proportional to the $P_{H2O}$. When the $P_{H2O}$ is higher than $1 \times 10^{-4}$ atm, $SiO_2$ "smoke" is formed away from the surface of the SiC by the reaction between SiO gas generated by the reaction in Equation (1) and the ambient $H_2O$ (the $P_{H2O}$ of which is much higher than the $P_{H2O}$ at the surface of the SiC). Depending on the reaction conditions such as gas flow rate and specimen geometry, some $SiO_2$ "smoke" may be deposited on the SiC surface. When this occurs, the deposited $SiO_2$ is neither continuous nor protective of the SiC. When $P_{H2O}$ is increased further to greater than about $4 \times 10^{-3}$ atm, typical passive oxidation occurs forming a dense, continuous and protective $SiO_2$ layer on the SiC surface. Once the continuous $SiO_2$ layer is formed on the surface, the $P_{SiO}$ drops rapidly.

In the process of the present invention, the $P_{H2O}$ was $1 \times 10^{-3}$ atm, which is in the range for $SiO_2$ smoke formation. When the aluminum based ceramic is placed in such an environment, $SiO_2$ should be deposited on the surface of the ceramic. Thus, the weight gains observed in FIG. 5 are believed to be a result of $SiO_2$ deposition on the surface of the aluminum based ceramic. For alumina, the $SiO_2$ reacts with $Al_2O_3$ to form mullite by the following reaction:

$$3Al_2O_3(s)+2SiO_2(s)=3Al_2O_3 \cdot 2SiO_2(s) \qquad (2)$$

The formation of mullite was confirmed by X-ray diffraction patterns (not shown). In addition, the estimated thickness of the mullite layer determined from the observed weight gains for the specimen exposed for 1 hour in Example 1 was about 1 μm, assuming all the $SiO_2$ was converted to the mullite by the reaction in Equation (2) and the thickness of the layer was uniform for all faces. Such a thickness is too thin to provide any compressive residual stress effect on the alumina substrate. This observation, together with the results from the above examples showing an increase in strength for both polished and ground specimens provide evidence that the strengthening effect of the present invention is due mainly to the blunting of surface flaws and cracks.

Thus, it will be seen that a process for strengthening aluminum based ceramics as well as a composition of matter comprising an aluminum based ceramic having a strength-enhancing silicon-containing layer on the surface of said ceramic has been provided. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A process for strengthening an alumina based ceramic, comprising:
    (a) providing an alumina based ceramic having a surface;
    (b) exposing an external source of silicon separate from said alumina based ceramic selected from the group consisting of silicon carbide platelets and silicon carbide powder to an atmosphere consisting essentially of hydrogen and water vapor to form an atmosphere consisting essentially of silicon monoxide gas; and
    (c) exposing said alumina based ceramic to the silicon monoxide atmosphere for a period of time sufficient and at a temperature of from about 1300° to 1500° C. to produce a silicon-containing film consisting essentially of the compound $3Al_2O_3 \cdot 2SiO_2$ at said surface of said ceramic that increases the strength of said ceramic.

2. The process of claim 1, wherein said water vapor has a partial pressure of about $10^{-3}$ atmospheres.

3. The process of claim 1, wherein said aluminum based ceramic is selected from the group consisting of monolithic aluminum oxide based ceramics, aluminum oxide based ceramic composites, and nonoxide aluminum based ceramics.

4. The process of claim 1, wherein said period of time is from about 0.5 to about 10 hours.

5. A process for strengthening an aluminum based ceramic, comprising:
    (a) providing an aluminum based ceramic having a surface selected from the group consisting of monolithic aluminum oxide based ceramics, aluminum oxide based ceramic composites, and nonoxide aluminum based ceramics;
    (b) exposing an external source of silicon separate from said aluminum based ceramic selected from the group consisting of silicon carbide platelets and silicon carbide powder to an atmosphere consisting essentially of hydrogen and water vapor, said water vapor having a partial pressure of about $10^{-3}$ atmospheres, to form an atmosphere consisting essentially of silicon monoxide gas; and
    (c) exposing said aluminum based ceramic to the silicon monoxide atmosphere for a period of time of from about 0.5 to 10 hours and at a temperature of from about 1300° to 1500° C. to produce a silicon-containing film consisting essentially of the compound $3Al_2O_3 \cdot 2SiO_2$ at said surface of said ceramic that increases the strength of said ceramic.

* * * * *